US012563995B2

(12) United States Patent
An et al.

(10) Patent No.: US 12,563,995 B2
(45) Date of Patent: Feb. 24, 2026

(54) SUBSTRATE TREATING APPARATUS

(71) Applicant: SEMES CO., LTD.,
Chungcheongnam-do (KR)

(72) Inventors: Young Seo An, Gyeonggi-do (KR); Jae Hoon Park, Gyeonggi-do (KR); Young Ju Jo, Gyeonggi-do (KR); Kyung Jin Seo, Chungcheongnam-do (KR); Seo Jung Park, Gyeonggi-do (KR); Dae Myeong Lee, Busan (KR); Jae Hyun Lim, Chungcheongnam-do (KR); Nam Kyu Kim, Chungcheongnam-do (KR)

(73) Assignee: SEMES CO., LTD., Chungcheongnam (KR)

(*) Notice: Subject to any disclaimer, the term of this patent is extended or adjusted under 35 U.S.C. 154(b) by 313 days.

(21) Appl. No.: 18/137,287

(22) Filed: Apr. 20, 2023

(65) Prior Publication Data

US 2024/0222155 A1     Jul. 4, 2024

(30) Foreign Application Priority Data

Dec. 29, 2022     (KR) ........................ 10-2022-0188822

(51) Int. Cl.
B08B 3/02          (2006.01)
B08B 9/093         (2006.01)
(Continued)

(52) U.S. Cl.
CPC ........ H01L 21/67051 (2013.01); B08B 3/022 (2013.01); B08B 9/093 (2013.01);
(Continued)

(58) Field of Classification Search
CPC ......... H01L 21/67051; H01L 21/68764; H01L 21/6715; H01L 21/67017; H01L 21/67098;
(Continued)

(56) References Cited

U.S. PATENT DOCUMENTS 5,677,000 A * 10/1997 Yoshioka ................ G03F 7/162
                                                           118/52
9,768,039 B2   9/2017 Aiura et al.
(Continued)

FOREIGN PATENT DOCUMENTS

KR     10-2014-0065343        5/2014
KR     10-2016-0113020        9/2016
(Continued)

OTHER PUBLICATIONS

KR20210113498 translation (Year: 2021).*
(Continued)

*Primary Examiner* — Michael E Barr
*Assistant Examiner* — Lauren G Orta
(74) *Attorney, Agent, or Firm* — WOMBLE BOND DICKINSON (US) LLP

(57) ABSTRACT

A substrate treating apparatus includes: a spin chuck supporting a substrate; a rinse liquid supply unit supplying a rinse liquid; and a bowl member surrounding the spin chuck, wherein the bowl member includes: a first bowl including an inclined surface inclined downward in an outward direction and having an upper surface of which at least a portion has a curvature; and an upper base disposed on the first bowl, a space between the upper surface of the first bowl and a lower surface of the upper base forms a first flow passage and at least a portion of the first flow passage is formed in an arc shape along the upper surface of the first bowl, and the rinse liquid is supplied toward the inclined surface of the first bowl through the first flow passage.

15 Claims, 10 Drawing Sheets

(51) Int. Cl.
*G03F 7/16* (2006.01)
*H01L 21/67* (2006.01)
*H01L 21/687* (2006.01)

(52) U.S. Cl.
CPC .... *H01L 21/68764* (2013.01); *B08B 2209/08* (2013.01); *G03F 7/162* (2013.01); *H01L 21/67017* (2013.01); *H01L 21/67098* (2013.01); *H01L 21/6715* (2013.01); *H01L 21/67225* (2013.01)

(58) Field of Classification Search
CPC ... H01L 21/67225; B08B 3/022; B08B 9/093; B08B 2209/08; G03F 7/162
See application file for complete search history.

(56) References Cited

U.S. PATENT DOCUMENTS

| | | | | |
|---|---|---|---|---|
| 11,823,914 | B2 | 11/2023 | Park et al. | |
| 2013/0269737 | A1* | 10/2013 | Mizuno | H01L 21/02041 134/157 |
| 2014/0261163 | A1* | 9/2014 | Kishita | H01L 21/68714 118/52 |
| 2021/0013058 | A1* | 1/2021 | Park | H01L 21/6715 |

FOREIGN PATENT DOCUMENTS

| | | | | |
|---|---|---|---|---|
| KR | 10-2021-0006566 | | 1/2021 | |
| KR | 10-2021-0113498 | | 9/2021 | |
| KR | 20210113498 | A * | 9/2021 | ............ G03F 7/162 |
| WO | WO-2021193200 | A1 * | 9/2021 | .............. B08B 9/08 |

OTHER PUBLICATIONS

WO2021193200 translation (Year: 2021).*
Notice of Allowance dated Feb. 9, 2025 for Korean Patent Application No. 10-2022-0188822 and its English translation from Global Dossier.

* cited by examiner

[FIG. 1]
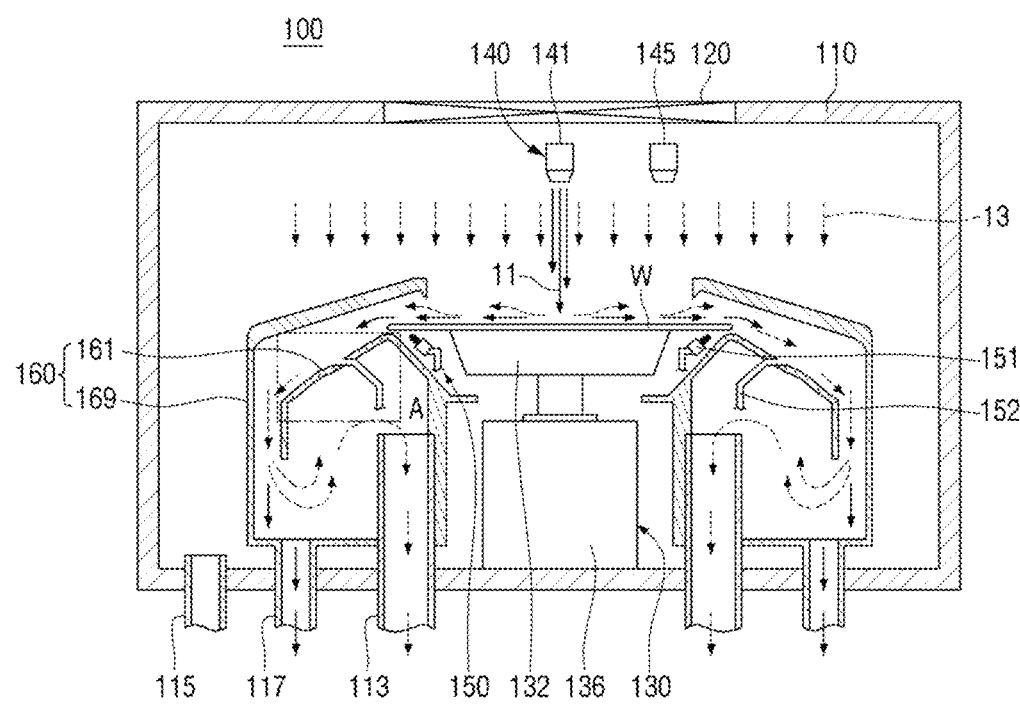
[FIG. 2]
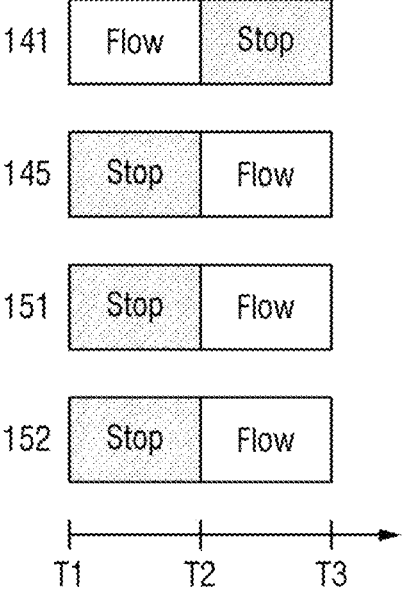

[FIG. 3]
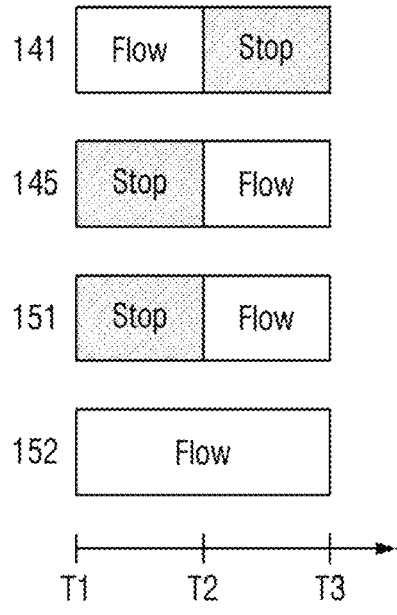
[FIG. 4]
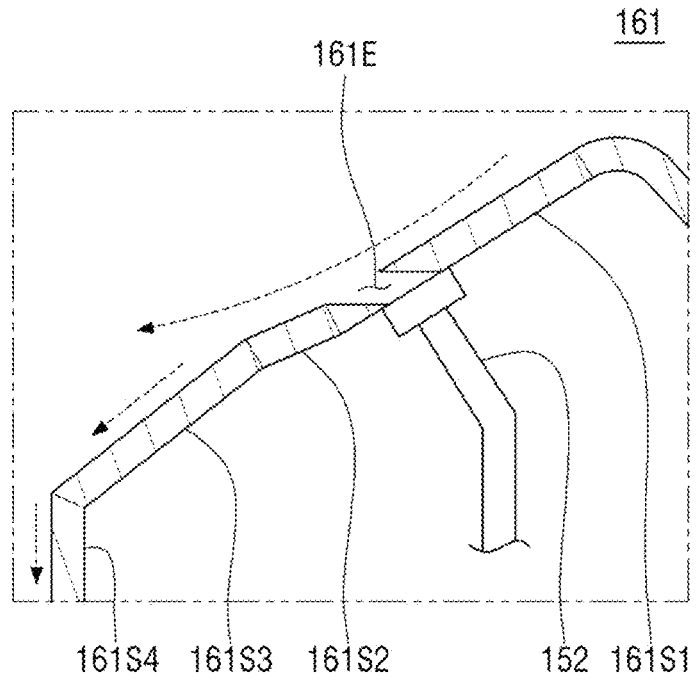

[FIG. 5]
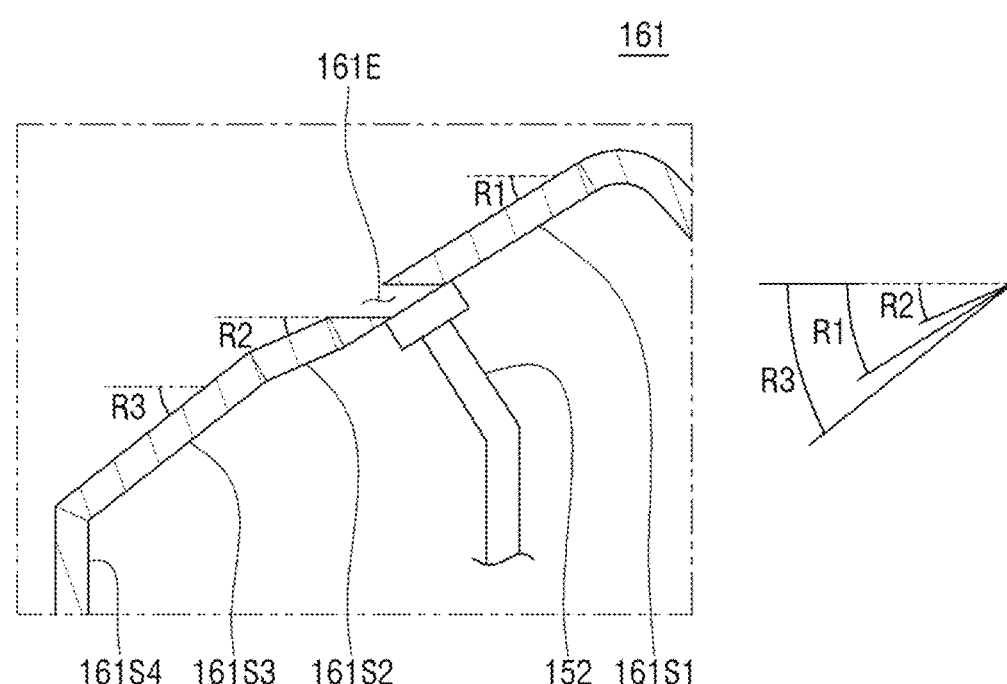

[FIG. 6]
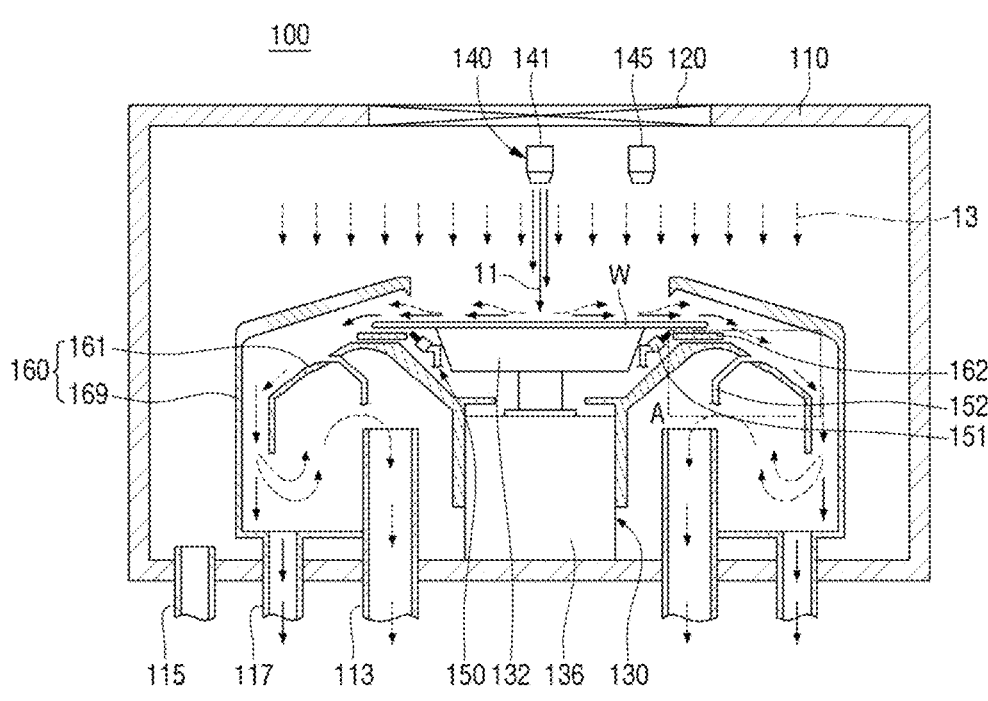
[FIG. 7]
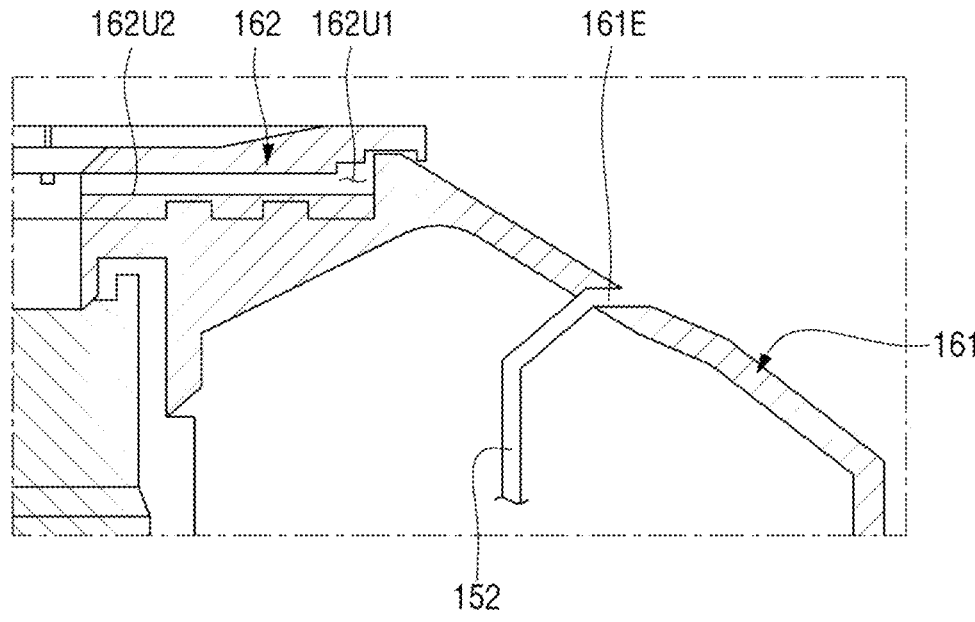

[FIG. 8]
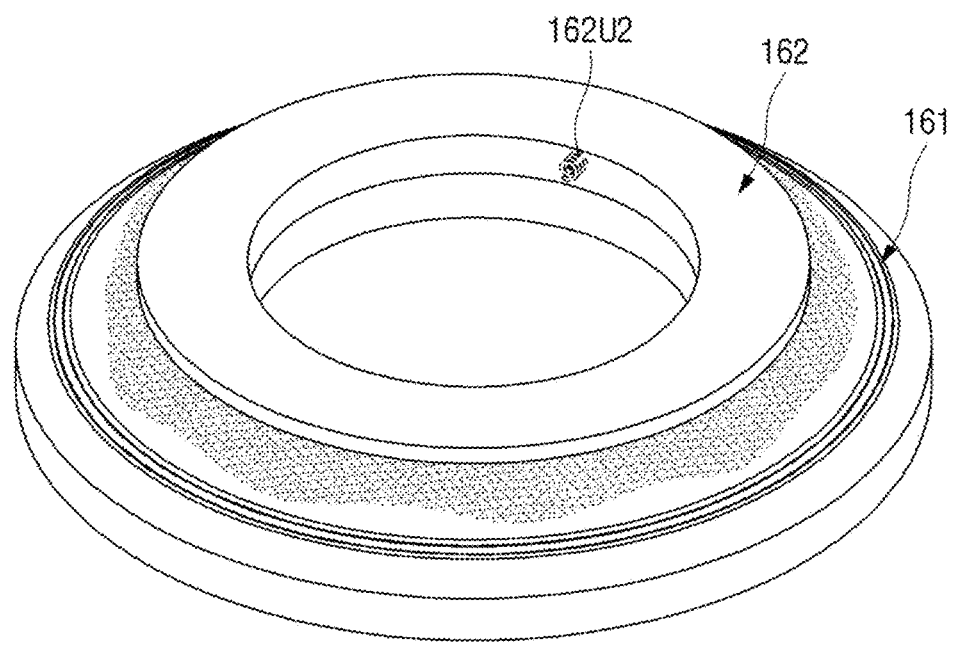
[FIG. 9]
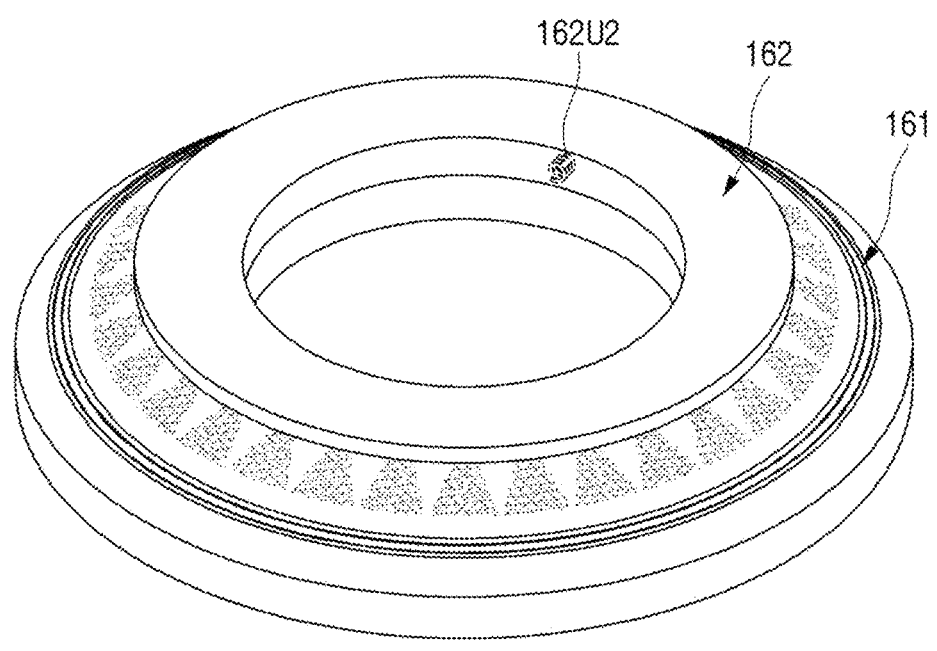

[FIG. 10]
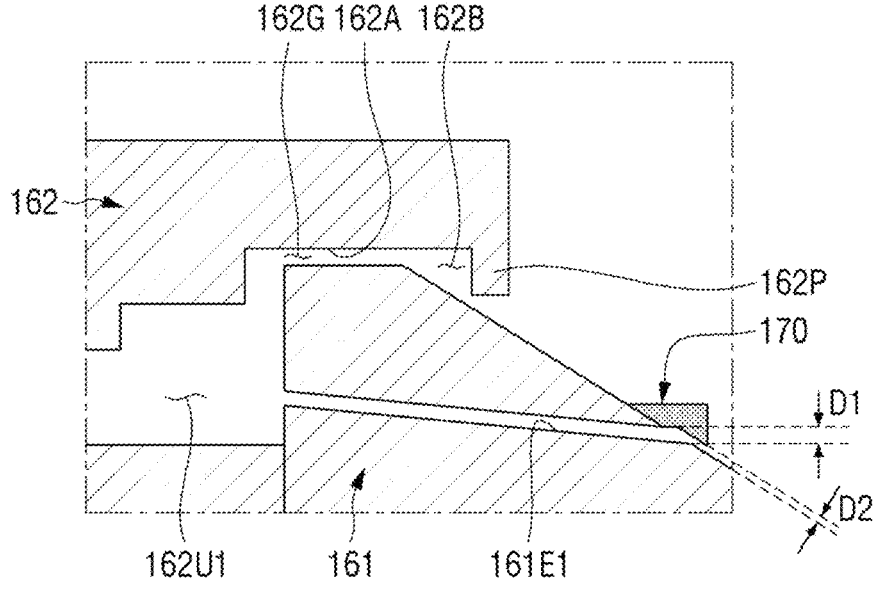
[FIG. 11]
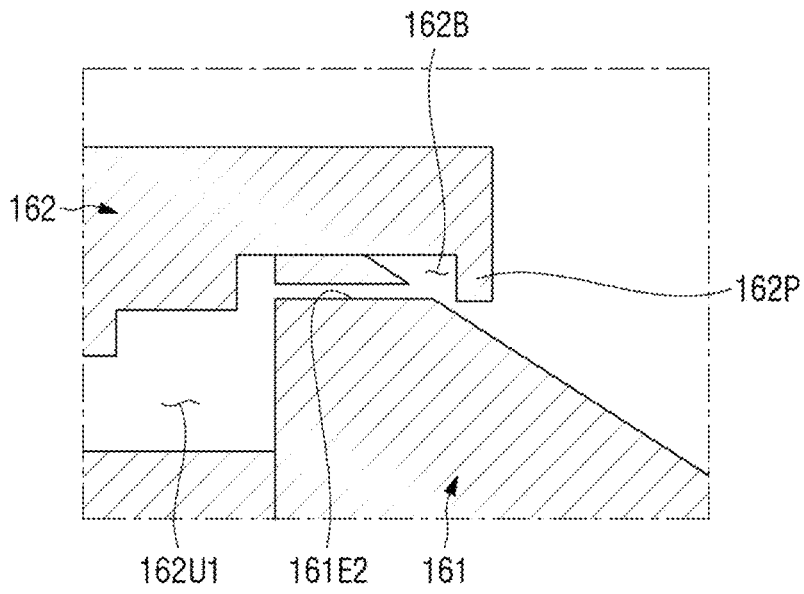

[FIG. 12]
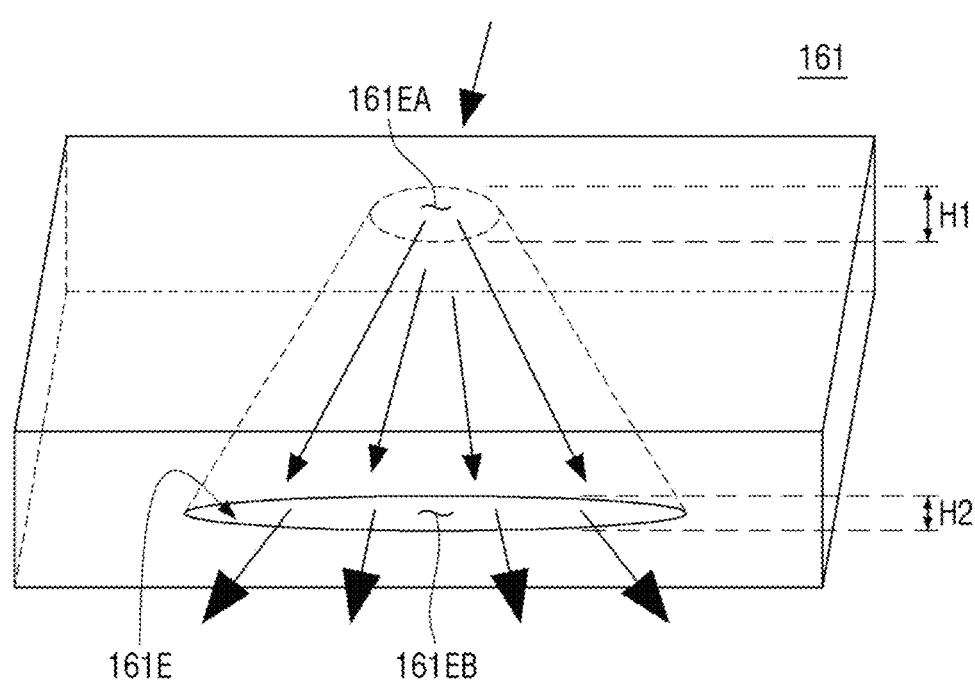

[FIG. 13]
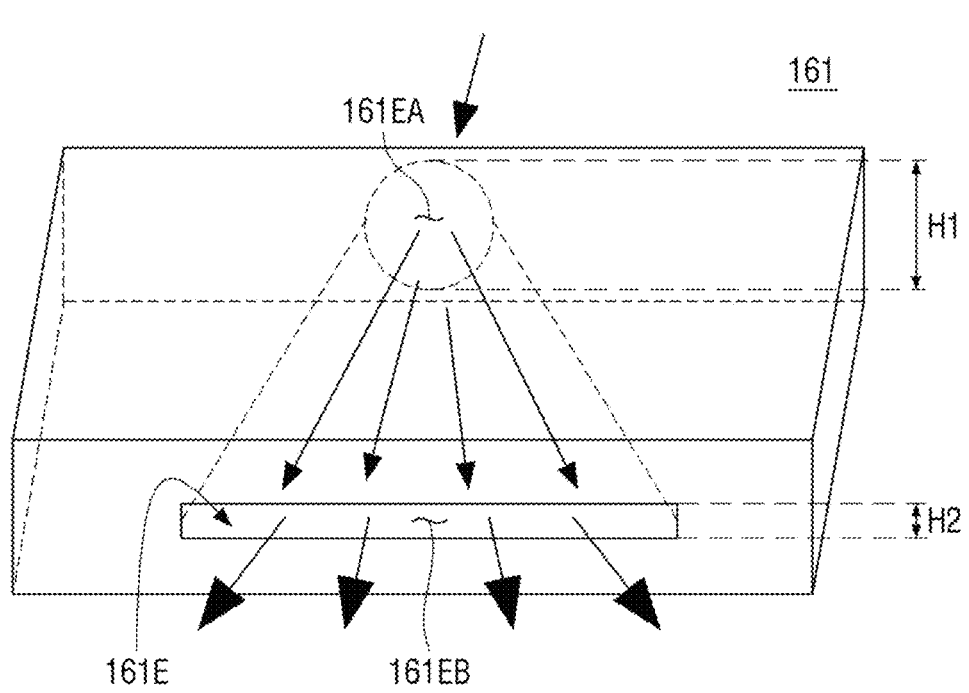

[FIG. 14]
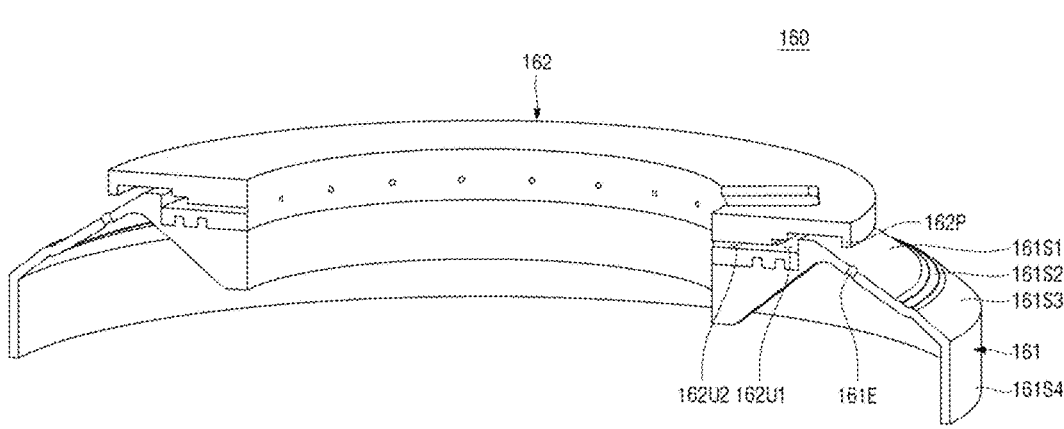

[FIG. 15]
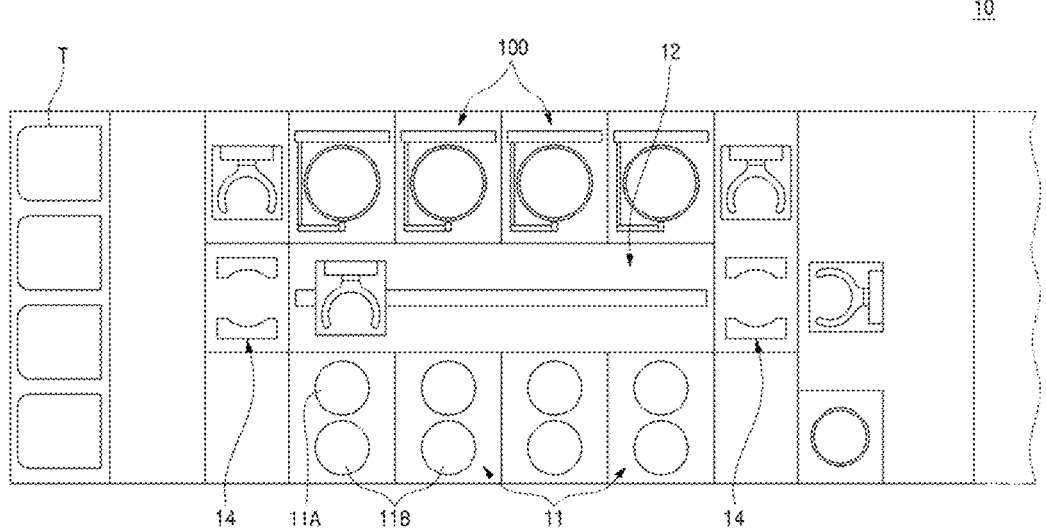
[FIG. 16]
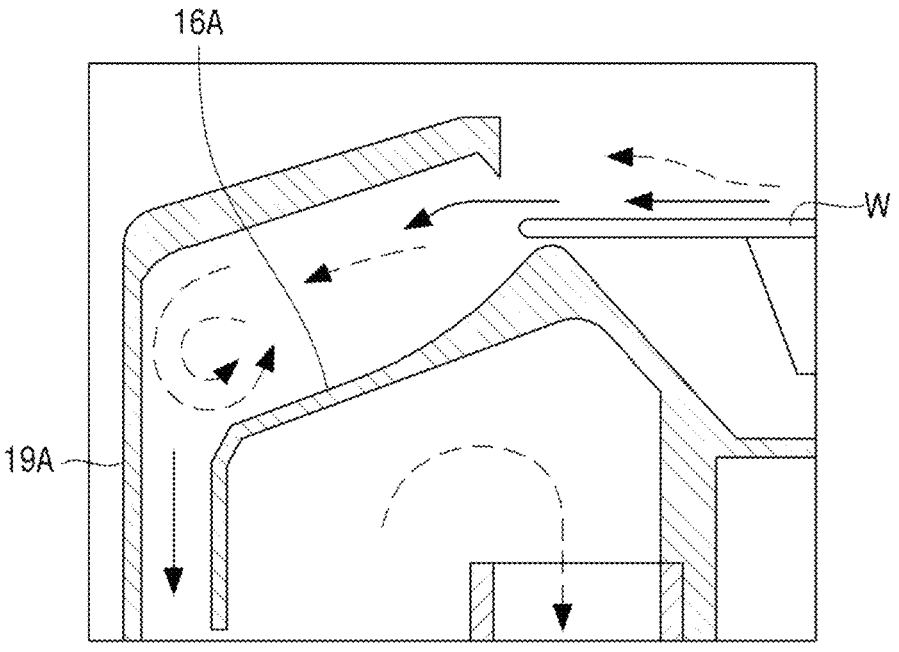

SUBSTRATE TREATING APPARATUS

CROSS-REFERENCE TO RELATED APPLICATION

This application claims priority from Korean Patent Application No. 10-2022-0188822 filed on Dec. 29, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a substrate treating apparatus.

2. Description of the Related Art

In processes of manufacturing semiconductor elements, a photolithography process, an etching process, an ashing process, a thin film depositing process, a cleaning process, and the like, are performed. In the photolithography process, the etching process, the ashing process, and the cleaning process among these processes, a process of treating a substrate by supplying a treatment liquid onto the substrate is performed. The photolithography process includes an applying step, an exposing step, and a developing step.

The applying step is an applying process of applying a photoresist onto the substrate, and a portion of the used photoresist is recovered through a bowl. The photoresist has viscosity and thus, may adhere to the bowl in a process in which it is recovered. For this reason, the bowl needs to be cleaned after the applying process of the substrate is performed.

SUMMARY

Meanwhile, the bowl should be separated from a substrate treating apparatus and be physically cleaned by a worker, which consumes a lot of time. That is, there is no structure in which the bowl is self-cleaned inside a liquid treating chamber where the bowl is accommodated, such that it takes time to separate the bowl in a state in which the applying process is stopped in order to clean the bowl, and accordingly, a maintenance time for the liquid treating chamber increases. In addition, when a treating vessel is contaminated by a large amount of photoresist, the bowl should be replaced. There is a need to develop a technology for decreasing the contamination of the bowl.

Aspects of the present disclosure provide a substrate treating apparatus capable of decreasing contamination of a bowl.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a substrate treating apparatus includes: a spin chuck supporting a substrate; a rinse liquid supply unit supplying a rinse liquid; and a bowl member surrounding the spin chuck, wherein the bowl member includes: a first bowl including an inclined surface inclined downward in an outward direction and having an upper surface of which at least a portion has a curvature; and an upper base disposed on the first bowl, a space between the upper surface of the first bowl and a lower surface of the upper base forms a first flow passage and at least a portion of the first flow passage is formed in an arc shape along the upper surface of the first bowl, and the rinse liquid is supplied toward the inclined surface of the first bowl through the first flow passage.

According to another aspect of the present disclosure, a substrate treating apparatus includes: a liquid treating chamber forming a liquid film on a substrate; a bake chamber heating the substrate on which the liquid film has been treated in the liquid treating chamber; and a transfer chamber provided between the liquid treating chamber and the bake chamber and transferring the substrate between the liquid treating chamber and the bake chamber, wherein the liquid treating chamber includes: a spin chuck supporting the substrate; a rinse liquid supply unit supplying a rinse liquid; and a bowl member surrounding the spin chuck, the bowl member includes: a first bowl including an inclined surface inclined downward in an outward direction and having an upper surface of which at least a portion has a curvature; and an upper base disposed on the first bowl, a space between the upper surface of the first bowl and a lower surface of the upper base forms a first flow passage and at least a portion of the first flow passage is formed in an arc shape along the upper surface of the first bowl, and the rinse liquid is supplied toward the inclined surface of the first bowl through the first flow passage.

According to still another aspect of the present disclosure, a substrate treating apparatus includes: a spin chuck supporting a substrate; a rinse liquid supply unit supplying a rinse liquid; a bowl member surrounding the spin chuck; and a fan filter unit forming airflow in a downward direction above the spin chuck, wherein the bowl member includes: a first bowl including an inclined surface inclined downward in an outward direction and having a first surface, a second surface, and a third surface sequentially formed from an upper portion thereof toward a lower portion thereof, including at least one discharge port discharging the rinse liquid and having an outlet having a greater width in a horizontal direction and a smaller width in a vertical direction than an inlet, and having a step formed by protrusion of an edge of an upper surface of which at least a portion has a curvature; an upper base disposed on the first bowl; and an auxiliary member surrounding outlets of one or more discharge ports, spaced apart from a protrusion part, and having a gap formed between the auxiliary member and the first bowl at a width smaller than that of the outlet of the discharge port, the second surface has an inclination angle different from those of the first surface and the third surface or has an inclination direction changed from those of the first surface and the third surface, some of a plurality of discharge ports have outlets formed on the first surface and the others of the plurality of discharge ports have outlets provided on the second surface or provided on a boundary surface between the first surface and the second surface, a space between the upper surface of the first bowl and a lower surface of the upper base forms a first flow passage and at least a portion of the first flow passage is formed in an arc shape along the upper surface of the first bowl, the upper base includes a first body, at least one second flow passage penetrating through the first body and connected to the first flow passage, and a protrusion part protruding from a lower surface of the first body in the downward direction so as to face the inclined surface of the first bowl, and has a first gap formed between the upper base and the step of the first bowl outside the first flow passage, the first flow passage has a greater height than the second flow passage or is bent one or more times with respect to the second flow passage, a buffer space is formed by the inclined surface of the first bowl, the lower surface of the upper base, and the protrusion part, the second flow passage, the first flow passage, and the buffer space are sequentially formed in an outward direction of the bowl member, an inlet through which the rinse liquid is introduced is formed in the second flow passage, and an outlet through which the rinse liquid is discharged is more adjacent to the first flow passage than the second flow passage, and the rinse liquid sequentially passes through the second flow passage, the first flow passage, and the buffer space and is discharged to the inclined surface of the first bowl.

According to yet still another aspect of the present disclosure, a substrate treating apparatus includes: a spin chuck supporting a substrate; a first bowl surrounding the spin chuck and including a plurality of discharge ports discharging a rinse liquid, having different widths in an inlet and an outlet thereof, and spaced apart from each other along a circumference of the first bowl; and a rinse liquid supply unit supplying the rinse liquid to the discharge ports.

Detailed contents of other exemplary embodiments are described in a detailed description and are illustrated in the drawings.

BRIEF DESCRIPTION OF THE DRAWINGS

The above and other aspects and features of the present disclosure will become more apparent by describing in detail exemplary embodiments thereof with reference to the attached drawings, in which:

FIG. 1 is a view illustrating a substrate treating apparatus according to a first exemplary embodiment of the present disclosure;

FIG. 2 is a view illustrating an example of flow states of fluids over time in a substrate treating apparatus according to some exemplary embodiments of the present disclosure;

FIG. 3 is a view illustrating another example of flow states of fluids over time in the substrate treating apparatus according to some exemplary embodiments of the present disclosure;

FIG. 4 is an enlarged view of region A of FIG. 1;

FIG. 5 is a view for describing an inclination angle of a first bowl of the substrate treating apparatus according to a first exemplary embodiment of the present disclosure;

FIG. 6 is a view illustrating a substrate treating apparatus according to a second exemplary embodiment of the present disclosure;

FIG. 7 is an enlarged view of region A of FIG. 6;

FIG. 8 is a view illustrating a bowl member of the substrate treating apparatus according to a second exemplary embodiment of the present disclosure;

FIG. 9 is a view illustrating a bowl member of a substrate treating apparatus according to a third exemplary embodiment of the present disclosure;

FIG. 10 is a view illustrating a protrusion part and a discharge port of the substrate treating apparatus according to some exemplary embodiments of the present disclosure;

FIG. 11 is a view illustrating another type of discharge port of the substrate treating apparatus according to some exemplary embodiments of the present disclosure;

FIG. 12 is a view illustrating a discharge port of the substrate treating apparatus according to some exemplary embodiments of the present disclosure;

FIG. 13 is a view illustrating another type of discharge port of the substrate treating apparatus according to some exemplary embodiments of the present disclosure;

FIG. 14 is a view illustrating an inclined surface of another type of first bowl in the substrate treating apparatus according to some exemplary embodiments of the present disclosure;

FIG. 15 is a view illustrating bake chambers and a transfer chamber together in the substrate treating apparatus according to some exemplary embodiments of the present disclosure; and FIG. 16 is a view illustrating a substrate treating apparatus according to a comparative example.

DETAILED DESCRIPTION OF THE EMBODIMENTS

Hereinafter, exemplary embodiments of the present disclosure will be described in detail with reference to the accompanying drawings. Advantages and features of the present disclosure and methods for accomplishing these advantages and features will become apparent from exemplary embodiments to be described later in detail with reference to the accompanying drawings. However, the present disclosure is not limited to exemplary embodiments to be disclosed below, but may be implemented in various different forms, these exemplary embodiments will be provided only in order to make the present disclosure complete and allow one of ordinary skill in the art to which the present disclosure pertains to completely recognize the scope of the present disclosure, and the present disclosure will be defined by the scope of the claims. Throughout the specification, the same components will be denoted by the same reference numerals.

The terms as used herein are for describing exemplary embodiments rather than limiting the present disclosure. In the present specification, a singular form includes a plural form unless stated otherwise in the phrase. Components, steps, operations, and/or elements mentioned by the terms "comprise" and/or "comprising" as used herein do not exclude the existence or addition of one or more other components, steps, operations, and/or elements.

FIG. 1 is a view illustrating a substrate treating apparatus according to a first exemplary embodiment of the present disclosure.

Referring to FIG. 1, a substrate treating apparatus 10 may perform a treatment liquid applying process, and may be provided with a liquid treating chamber 100. The liquid treating chamber 100 of the substrate treating apparatus 10 may include a housing 110, a fan filter unit 120, a substrate support unit 130, a liquid supply unit 140, a rinse liquid supply unit 150, an auxiliary member 170 (see FIG. 10), and a bowl member 160. Here, reference numeral 11 denotes a flow of treatment liquid, and reference numeral 13 denotes airflow.

The housing 110 may be provided with a space in which the substrate support unit 130, the bowl member 160, and the like, are provided. An opening (not illustrated) may be formed on one side of the housing 110. The opening is an entrance through which a substrate W is carried in and out, and may be installed with a door (not illustrated). The door may seal the space of the housing 110 by blocking the opening when a substrate treating process is performed.

A first exhaust port 113, a second exhaust port 115, and a discharge line 117 may be formed at a lower end of the housing 110. The airflow formed in the housing 110 may be exhausted to the outside through the first exhaust port 113 and the second exhaust port 115.

As an example, airflow inside the bowl member 160 may be exhausted through the first exhaust port 113, and airflow outside the bowl member 160 may be exhausted through the second exhaust port 115. In addition, a treatment liquid and a rinse liquid may be discharged to the outside through the discharge line 117.

The first exhaust port 113 may be positioned on a circumferential surface of a cup of a first bowl 161 so that a gas is exhausted therethrough and a liquid does not pass therethrough, and may extend in an upward direction from a bottom surface of a second bowl 169. In addition, the discharge line 117 may be formed so as not to protrude from the bottom surface of the second bowl 169 so that the treatment liquid remains as little as possible on a bottom surface of the bowl member 160.

Although not illustrated in FIG. 1, an elevating unit may be provided in the housing 110. The elevating unit may adjust a relative height between the substrate support unit 130 and the bowl member 160. As an example, the elevating unit may be provided to be connected to the bowl member 160 or the substrate support unit 130 to elevate or lower the bowl member 160 or the substrate support unit 130. The elevating unit may include a bracket and a motor, but is not limited thereto.

The fan filter unit 120 may be installed at an upper end of the housing 110. The fan filter unit 120 may include a fan and a filter, and may form descending airflow in an internal space of the housing 110. That is, the fan filter unit 120 may form airflow in a downward direction above the substrate support unit 130.

Particles may be discharged to the outside via the first exhaust port 113 and the second exhaust port 115 through the descending airflow formed in the internal space of the housing 110. The fan filter unit 120 may be provided with a line communicating with the outside, and may supply outside air to the inside of the housing 110 through the line.

The substrate support unit 130 may support and rotate the substrate W. The substrate support unit 130 may be provided as a spin chuck, and may include a support plate 132 and an actuator 136. The support plate 132 may be provided as a circular plate having a smaller diameter than the substrate W. The actuator 136 may be provided as a motor, and may provide a torque to the support plate 132 so that the support plate 132 rotates.

The liquid supply unit 140 may supply the treatment liquid and/or the rinse liquid onto the substrate W. For example, the treatment liquid may be a photoresist, and the rinse liquid may be a thinner/solvent that dilutes the treatment liquid. The liquid supply unit 140 may include a first nozzle 141 and a second nozzle 145.

The first nozzle 141 may supply the treatment liquid at a central position of the substrate W. The first nozzle 141 may discharge the treatment liquid to the substrate W at a position facing a central portion of the substrate W. Although not illustrated in FIG. 1, the first nozzle 141 may be connected to a treatment liquid supply part (which may include a treatment liquid storage tank).

The second nozzle 145 may supply the rinse liquid at the central position of the substrate W and/or at an edge position of the substrate W. That is, the second nozzle 145 may be provided to discharge the rinse liquid to the entire substrate W or discharge the rinse liquid to a bevel formed at an edge of the substrate W. Various modified examples such as an example in which the second nozzle 145 may receive the rinse liquid from a separate supply part or may be connected to the rinse liquid supply unit 150 to receive the rinse liquid are possible.

Times required for the first nozzle 141 and the second nozzle 145 to treat the substrate W may be different from each other. For example, after the substrate W is treated through the first nozzle 141, the substrate W may be treated through the second nozzle 145.

The rinse liquid supply unit 150 may supply the rinse liquid for cleaning the substrate W and the bowl member 160. The rinse liquid supply unit 150 may supply the rinse liquid to the second nozzle 145 in order to clean an upper surface of the substrate W. In addition, the rinse liquid supply unit 150 may include a first rinse liquid line 151 and a second rinse liquid line 152 in order to clean a lower surface of the substrate W and the bowl member 160. The first rinse liquid line 151 and the second rinse liquid line 152 may form a branched structure to receive the rinse liquid from one storage tank. However, the present disclosure is not limited thereto.

The first rinse liquid line 151 may have an outlet directed toward the lower surface of the substrate W. For example, when the substrate W is rotated by the substrate support unit 130, the treatment liquid may be supplied from the first nozzle 141 to the upper surface of the substrate W. In this case, the treatment liquid may enter the lower surface of the substrate W along the edge of the substrate W due to its viscosity. As such, an unnecessary liquid film may be formed on the lower surface of the substrate W, such that the lower surface of the substrate W needs to be cleaned. The cleaning of the lower surface of the substrate W may be performed by the rinse liquid discharged through the first rinse liquid line 151.

A nozzle (no reference numeral) may be provided at an end of the first rinse liquid line 151, and the rinse liquid may be supplied to the lower surface of the substrate W through the nozzle. In addition, since the nozzle may be provided so that an angle is changed in multiple directions, various modified examples such as an example in which a discharge port of the nozzle may be directed toward the bowl member 160 in addition to the lower surface of the substrate W are possible.

The second rinse liquid line 152 may have a discharge port connected to the bowl member 160, installed to at least partially penetrate through the bowl member 160, or provided toward the bowl member 160. That is, the second rinse liquid line 152 may be provided in various structures for cleaning the bowl member 160. In addition, the second rinse liquid line 152 may be provided with a connector so as to be connected to the bowl member 160.

For example, when the treatment liquid is accumulated on the substrate W, the bowl member 160 should be replaced. In order to increase a replacement cycle of the bowl member 160, the second rinse liquid line 152 may supply the rinse liquid to the bowl member 160.

The bowl member 160 may be provided to surround the substrate support unit 130. The bowl member 160 may include a first bowl 161 and a second bowl 169.

The first bowl 161 may surround the substrate support unit 130 to prevent the substrate support unit 130 from being contaminated. At least a portion of the first bowl 161 may have a curvature. As an example, an upper of the first bowl 161 may have a ring shape.

In addition, the first bowl 161 may have a structure in which it is inclined downward in an outward direction to guide a flow of fluid such as the rinse liquid. For example, an inclined surface may be formed on the first bowl 161, and may be positioned above the first exhaust port 113 below the substrate W. The inclined surface of the first bowl 161 may be inclined downward in the outward direction.

An edge of the inclined surface of the first bowl 161 may face the discharge line 117 or be provided outside the discharge line 117 to allow the treatment liquid to be easily introduced into the discharge line 117. In addition, the edge of the first bowl 161 may be spaced apart from the first exhaust port 113 while extending in the downward direction, to prevent the treatment liquid that has passed through the first bowl 161 from being introduced into the first exhaust port 113. In addition, a cup may be provided inside the inclined surface of the first bowl 161, and may be provided in a structure in which it surrounds a rotating shaft.

The first bowl 161 may have a structure in which it is easily cleaned with the rinse liquid, and may include a plurality of discharge ports 161E, 161E1, and 161E2 formed to discharge the rinse liquid. This will be described later with reference to FIGS. 4 and 5.

The second bowl 169 may be provided in a cylindrical structure in which it surrounds the first bowl 161 outside the first bowl 161. An upper portion of the second bowl 169 may have an inclined surface spaced apart from the first bowl 161 above the first bowl 161. The upper portion of the second bowl 169 may be positioned higher than the substrate W. Airflow introduced along the substrate W may pass below an upper structure (inclined surface) of the second bowl 169. A lower portion of the second bowl 169 may be formed in a cup shape. That is, the lower portion of the second bowl 169 may be provided with a circumferential surface and a bottom surface. The first exhaust port 113 and the discharge line 117 may be installed on the bottom surface of the second bowl 169.

The second bowl 169 may be formed by separately providing the upper portion and the lower portion and then coupling the upper portion and the lower portion to each other. This is to easily install the first exhaust port 113 and the discharge line 117 in the second bowl 169, but the present disclosure is not limited thereto.

The auxiliary member 170 that has not been described will be described later with reference to FIG. 10.

Hereinafter, the supply of the treatment liquid and the rinse liquid will be described with reference to the drawings.

FIGS. 2 and 3 are views illustrating flow states of fluids over time in the substrate treating apparatus according to some exemplary embodiments of the present disclosure.

It may be changed depending on process times whether or not fluids (treatment liquid and rinse liquid) supplied in the substrate treating process are supplied.

As an example, referring to FIG. 2, during a first process time (T1 to T2), a flow of the treatment liquid may be formed through the first nozzle 141, such that the treatment liquid may be supplied from the first nozzle 141 to the upper surface of the substrate W. After the treatment liquid such as the photoresist is applied onto the substrate W, a flow of the fluid through the first nozzle 141 may be blocked. That is, during a second process time (T2 to T3) after the first process time, the flow of the treatment liquid through the first nozzle 141 may be blocked.

Meanwhile, during the second process period (T2 to T3), a flow of fluid may be formed through the second nozzle 145, the first rinse liquid line 151, and the second rinse liquid line 152. In other words, the rinse liquid may be supplied so that the lower surface of the substrate W and the bowl member 160 are cleaned while the upper surface of the substrate W is cleaned.

For example, the rinse liquid may be supplied from the first rinse liquid line 151 to the lower surface of the substrate W so that the lower surface of the substrate W is cleaned while a flow of the rinse liquid is formed from the second nozzle 145 to the upper surface of the substrate W. At the same time, the rinse liquid may be supplied from the second rinse liquid line 152 to the bowl member 160 so that the bowl member 160 is cleaned.

Here, the rinse liquid is supplied to the lower surface of the substrate W after the photoresist is applied onto the substrate W in order to prevent the rinse liquid having a different temperature such as room temperature from being supplied to the lower surface of the substrate W on which heat is generated by a torque of the substrate support unit 130. That is, this is to minimize an influence of the photoresist treated at different thicknesses depending on a temperature to uniformly apply the treatment liquid onto the substrate W. Accordingly, the supply of the rinse liquid may have various modified examples as long as it does not influence on the substrate W.

As another example, referring to FIG. 3, when the treatment liquid is discharged from the first nozzle 141 to the substrate W during the first process time (T1 to T2) as in an example, a flow of fluid through the first rinse liquid line 151 may be blocked.

On the other hand, during the first process time (T1 to T2) during which the first nozzle 141 discharges the treatment liquid to the upper surface of the substrate W, a flow passage of the second rinse liquid line 152 is opened, such that the rinse liquid may be supplied to the bowl member 160.

That is, a flow of fluid passing through the first rinse liquid line 151 may not be performed simultaneously with a flow of fluid passing through the first nozzle 141. On the other hand, a flow of fluid passing through the second rinse liquid line 152 is not performed together with a flow of fluid through the first nozzle 141 and may be performed simultaneously with a flow of fluid through the second nozzle 145 according to an exemplary embodiment or may be performed simultaneously with a flow fluid through the second nozzle 145 while being performed simultaneously with a flow of fluid through the first nozzle 141 as another example.

Hereinafter, the inclined surface of the first bowl 161 will be described with reference to the drawings.

FIGS. 4 and 5 are views for describing a first bowl of the substrate treating apparatus according to a first exemplary embodiment of the present disclosure. In addition, FIG. 16 is a view illustrating a substrate treating apparatus according to a comparative example.

Referring to FIGS. 4 and 5, the first bowl 161 may have a first surface 161S1, a second surface 161S2, a third surface 161S3, and a fourth surface 161S4. The first surface 161S1, the second surface 161S2, the third surface 161S3, and the fourth surface 161S4 may be sequentially provided.

First, the fourth surface 161S4 may extend from a lower portion of the third surface 161S3. The fourth surface 161S4 may form a right angle with respect to the ground, and may have a cylindrical shape.

The second surface 161S2 may have an inclination angle different from those of the first surface 161S1 and the third surface 161S3 or may have an inclination direction changed from those of the first surface 161S1 and the third surface 161S3. An example is as follows.

The second surface 161S2 may have a gentler inclination than the first surface 161S1. However, the present disclosure is not limited thereto, and a modified example of the second surface 161S2 will be described with reference to FIG. 14.

The third surface 161S3 may have a steeper inclination than the second surface 161S2. In addition, the third surface 161S3 may have a steeper inclination than the first surface 161S1. In other words, the third surface 161S3 may have the greatest inclination angle R3, the first surface 161S1 may have the second greatest inclination angle R1, and the second surface 161S2 may have the smallest inclination angle R2.

Airflow moving along the first bowl 161 may be formed by the descending airflow generated by the fan filter unit 120. That is, the descending airflow generated in the fan filter unit 120 passes through the substrate W and is then introduced between the first bowl 161 and the second bowl 169. In this case, the airflow may be guided along the first bowl 161.

Here, the airflow moving along the first bowl 161 may sequentially pass through the first surface 161S1, the second surface 161S2, and the third surface 161S3. In particular, the airflow that has passed through the first surface 161S1 may become gentle while passing through the second surface 161S2 having a gentle inclination.

For example, referring to FIG. 16 illustrating a comparative example, an inclined surface in the same or similar range may be formed from a central portion of an inclined surface of a first bowl 16A to an edge of the inclined surface of the first bowl 16A adjacent to an inner wall of a second bowl 19A, and airflow may be formed along such an inclined surface. In this case, the airflow collides with the inner wall of the second bowl 19A, such that vortex/backflow may occur in a region adjacent to the second bowl 19A. The vortex/backflow occurs in a direction in which the airflow is re-introduced into the substrate W, such that there is a risk that particles included in the airflow will contaminate the substrate W.

On the other hand, the present exemplary embodiment has a structure in which variously changed inclination angles such as inclination angles of the first surface 161S1, the second surface 161S2, and the third surface 161S3, that is, steep inclinations and a gentle inclination are repeated, such that the introduction of the particles into the substrate W may be minimized.

In other words, the airflow that has passed through the first surface 161S1 becomes gentle on the second surface 161S2, and then spreads on the third surface 161S3, such that the airflow colliding with an inner wall of the second bowl 169 may be weakened, and accordingly, the vortex/backflow may be decreased.

Hereinafter, modified examples of the present exemplary embodiment will be described with reference to the drawings, an overlapping description of the same components performing the same functions will be omitted, and contents different from those described above will be mainly described.

FIGS. 6 to 8 are views illustrating a substrate treating apparatus according to a second exemplary embodiment of the present disclosure. FIG. 9 is a view illustrating a bowl member of a substrate treating apparatus according to a third exemplary embodiment of the present disclosure. In addition, FIGS. 10 to 13 are views illustrating discharge ports of the substrate treating apparatus according to some exemplary embodiments of the present disclosure.

Referring to FIGS. 6 to 9, each of liquid treating chambers 100 of substrate treating apparatuses 10 according to second and third exemplary embodiments may include a housing 110, a fan filter unit 120, a substrate support unit 130, a liquid supply unit 140, a rinse liquid supply unit 150, an auxiliary member 170, and a bowl member 160, like or similar to the liquid treating chamber of the substrate treating apparatus according to a first exemplary embodiment.

Second and third exemplary embodiments may be different from each other only in a shape of a first flow passage 162U1 For example, the first flow passage 162U1 according to a second exemplary embodiment may be formed in a ring shape, and the first flow passage 162U1 according to a third exemplary embodiment may be formed in a plurality of arc shapes and may be formed in a single ring shape by virtually connecting the plurality of arc shapes to each other.

Each of the bowl members 160 according to second and third exemplary embodiments may further include an upper base 162 unlike a first exemplary embodiment.

The upper base 162 may be disposed above the first bowl 161, may surround an upper portion of the first bowl 161, and may be formed in a ring shape so that the substrate support unit 130 is positioned at the center thereof. As an example, the upper base 162 may be fitted to the upper portion of the first bowl 161 (see FIGS. 7 and 14). However, the present disclosure is not limited thereto, and various modified examples such as an example in which the upper base 162 may be fixed to the first bowl 161 with an adhesive are possible.

The upper base 162 may be provided with a structure supplying the rinse liquid. As an example, the upper base 162 may have a first flow passage 162U1 and a second flow passage 162U2 formed therein, and may include a protrusion part 162P.

The first flow passage 162U1 is formed as a space between an upper surface of the first bowl 161 and a lower surface of the upper base 162, such that at least a portion of the first flow passage 162U1 may be formed in an arc shape along the upper surface of the first bowl 161. For example, the first flow passage 162U1 may be formed in a ring shape along an outer circumferential surface of the upper base 162. That is, the first flow passage 162U1 may be formed in a structure in which an edge circumference of the upper base 162 is concave in a ring shape. A portion of an outer side of the first flow passage 162U1 may be surrounded by a region protruding from the upper surface of the first bowl 161. Alternatively, various modified examples such as an example in which a lower portion of the first flow passage 162U1 along with a portion of the outer side of the first flow passage 162U1 may be surrounded by the upper surface of the first bowl 161 are possible. Accordingly, the first flow passage 162U1 may be easily formed by the design of a mold without post-processing.

In addition, a buffer space 162B together with the first flow passage 162U1 may be provided as a space having a ring shape. Accordingly, the rinse liquid may be simultaneously discharged along the entire circumference of the upper base 162 (see FIG. 8).

As another example, the first flow passage 162U1 may be provided as a space having an arc shape. The first flow passage 162U1 may be provided as a plurality of spaces having an arc shape to have a single ring shape that is virtually connected. Here, the buffer space 162B may be provided as a space having a ring shape or may be provided as a space having an arc shape like the first flow passage 162U1 having the arc shape.

When the buffer space 162B is formed in the ring shape, even though the first flow passage 162U1 has the arc shape, the rinse liquid may be diffused in the buffer space 162B and simultaneously discharged along the entire circumference of the buffer space 162B. Alternatively, when the buffer space 162B is formed in the arc shape, like to or similar to the first flow passage 162U1, the rinse liquid may be discharged at intervals along a circumference of the upper base 162 (see FIG. 9).

The second flow passage 162U2 may penetrate through a first body (no reference numeral) (injection structure of the upper base 162) included in the upper base 162. As an example, the second flow passage 162U2 may penetrate from an inner peripheral surface (opposite to the first flow passage 162U1) or a lower surface of the first body toward the first flow passage 162U1 and be connected to the first flow passage 162U1.

A branch line (not illustrated) branched from the second rinse liquid line 152 may be connected to the second flow passage 162U2, and one or more second flow passages 162U2 may be provided (see FIG. 14). The rinse liquid may be discharged from the second flow passage 162U2 to the inclined surface of the first bowl 161 through the first flow passage 162U1.

In addition, the second flow passage 162U2, the first flow passage 162U1, a first gap 162G, and the buffer space 162B may have a structure in which heights thereof increase toward the outside so that a direction of a flow of the rinse liquid may be changed one or more times or a space may be expanded in at least some sections (which may be the first flow passage 162U1 and the buffer space 162B in the present exemplary embodiment). That is, heights may gradually increase in the order of the second flow passage 162U2, the first flow passage 162U1, and the first gap 162G.

For example, the second flow passage 162U2, the first flow passage 162U1, and the buffer space 162B may be sequentially formed in an outward direction of the bowl member 160, in other words, an outward direction of the upper base 162. An inlet through which the rinse liquid is introduced may be formed in the second flow passage 162U2, and an outlet (a second gap between a lower end of the protrusion part 162P and the first bowl 161 and the buffer space 162B) through which the rinse liquid is discharged may be more adjacent to the first flow passage 162U1 than the second flow passage 162U2. In addition, the first flow passage 162U1 may have a greater height than the second flow passage 162U2 or may have a structure in which a perpendicular cut surface is bent one or more times with respect to the second flow passage 162U2.

In addition, the upper surface of the first bowl 161 protrudes at an edge thereof, such that a step may be formed. The upper base 162 may have the first gap 162G formed between a lower surface 162A of the upper base 162 and the step formed on the upper surface of the first bowl 161 so that the first flow passage 162U1 and the buffer space 162B communicate with each other. Accordingly, the upper base 162 may have a structure in which the rinse liquid passes through the buffer space 162B from the first flow passage 162U1. Accordingly, the rinse liquid may pass through the first flow passage 162U1 and the first gap 162G and be then supplied to the inclined surface of the first bowl 161 via the buffer space 162B.

As another example, referring to FIG. 11, the rinse liquid may move from the first flow passage 162U1 to the buffer space 162B by the discharge port 161E2. That is, an outlet of the discharge port 161E2 may penetrate toward the buffer space 162B so that the rinse liquid is supplied from the first flow passage 162U1 to the buffer space 162B. In this case, the lower surface 162A of the upper base 162 may be provided to be in contact with the upper end (upper surface of the step) of the first bowl 161.

The protrusion part 162P is a component forming a space through which the rinse liquid passes, and may protrude from an edge of the upper base 162 in the downward direction so that the upper base 162 surrounds a portion of the inclined surface of the first bowl 161 above the first bowl 161. The buffer space 162B may be formed between the protrusion part 162P and the first bowl 161 by a protrusion structure of the protrusion part 162P.

The buffer space 162B may be a space in which the rinse liquid supplied from the rinse liquid supply unit 150 stays. For example, the protrusion part 162P may protrude from the lower surface 162A of the upper base 162 in the downward direction so as to face the inclined surface of the first bowl 161. The buffer space 162B may be formed by such a protrusion part 162P. That is, the buffer space 162B may be formed by the inclined surface of the first bowl 161, the lower surface 162A of the upper base 162, and the protrusion part 162P. The buffer space 162B may communicate with the first flow passage 162U1 through the first gap 162G.

Here, the second gap is formed between the lower end of the protrusion part 162P and the first bowl 161, such that the rinse liquid in the buffer space 162B may be discharged to the first bowl 161. In other words, the second gap between the first bowl 161 and the protrusion part 162P constitutes an outlet, such that the rinse liquid may pass through the buffer space 162B and be then discharged to the first bowl 161.

Since the rinse liquid passes through the inclined surface of the first bowl 161 in the buffer space 162B after it is supplied to the buffer space 162B, the rinse liquid supplied above the first bowl 161 may be prevented from being scattered in the buffer space 162B and be then discharged in the downward direction.

In addition, the buffer space 162B may have a structure in which a cross-sectional area thereof decreases toward an outlet. As an example, the buffer space 162B may decrease from an upper portion thereof toward a lower portion thereof. As the cross-sectional area of the buffer space 162B decreases from the upper portion toward the lower portion, the protrusion part 162P may protrude in the downward direction and protrude vertically so that the upper base 162 surrounds a circumference of the first bowl 161. However, the present disclosure is not limited thereto.

The first bowl 161 may have discharge ports 161E, 161E1, and 161E2 formed to discharge the rinse liquid. In other words, the first bowl 161 may have a plurality of discharge ports 161E, 161E1, and 161E2 formed to penetrate through a second body (no reference numeral) formed as an injection structure.

The rinse liquid supply unit 150 is connected to the discharge ports 161E, 161E1, and 161E2, such that the rinse liquid may pass through the discharge ports 161E, 161E1, and 161E2. When the plurality of discharge ports 161E, 161E1, and 161E2 are formed in a vertical direction, any one of the plurality of discharge ports 161E, 161E1, and 161E2 may be provided on the first surface 161S1 and the second surface 161S2. This is to allow the rinse liquid to be sufficiently supplied to a dead zone that may occur in a gentle section. That is, this is to allow the rinse liquid to be sufficiently supplied to the second surface 161S2.

The discharge ports 161E, 161E1, and 161E2 may penetrate through the first bowl 161 from the inside of the first bowl 161 to the outside of the first bowl 161. The plurality of discharge ports 161E, 161E1, and 161E2 may be formed to be spaced apart from each other along the circumference of the first bowl 161.

Positions of outlets of the plurality of discharge ports 161E, 161E1, and 161E2 may be various. In addition, various modified examples such as an example in which all of the plurality of discharge ports 161E, 161E1, and 161E2 may be provided in one bowl member 160 are possible.

The plurality of discharge ports 161E, 161E1, and 161E2 may be provided to be spaced apart from each other in the vertical direction while being provided to be spaced apart from each other in a horizontal direction. Accordingly, the rinse liquid may be supplied in a plurality of regions in the vertical direction of the first bowl 161. That is, the bowl member 160 may have a structure in which the rinse liquid is supplied several times in the plurality of regions in the vertical direction of the first bowl 161. The positions of the discharge ports 161E, 161E1, and 161E2 may be various, and are as follows.

Referring to FIG. 10, the discharge port 161E1 may have an outlet formed toward a lower portion of the buffer space 162B so as to be spaced apart from the buffer space 162B.

Alternatively, referring to FIG. 11, the discharge port 161E2 may have an outlet formed toward the buffer space 162B. That is, the outlets of the discharge ports 161E, 161E1, and 161E2 may be formed at various positions where the supply of the rinse liquid may be optimized.

Referring to FIGS. 12 and 13, an inlet 161EA and an outlet 161EB of each of the discharge ports 161E, 161E1, and 161E2 may have different widths. Each of the discharge ports 161E, 161E1, and 161E2 may have a width in the horizontal direction that increases toward the outside so that the rinse liquid may spread, and may have a width in the vertical direction that decreases toward the outside so that a flow velocity does not decrease, such that a height H1 of the inlet 161EA may be greater than a height H2 of the outlet 161EB.

As an example, each of the discharge ports 161E, 161E1, and 161E2 may have a fan shape in which a width thereof increases from the inlet 161EA toward the outlet 161EB, when viewed from above. Here, the inlet 161EA of each of the discharge ports 161E, 161E1, and 161E2 may be positioned inside the first bowl 161 and be connected to the rinse liquid supply unit 150, and the rinse liquid may be introduced through the inlet 161EA. The outlet 161EB of each of the discharge ports 161E, 161E1, and 161E2 may be positioned outside the first bowl 161, and the rinse liquid may be discharged through the outlet 161EB.

The discharge ports 161E, 161E1, and 161E2 may have the same cross-sectional area in the inlet 161EA and the outlet 161EB, but various modified examples such as an example in which the discharge ports 161E, 161E1, and 161E2 may have a cross-sectional area that decreases toward the outlet 161EB are possible.

As an example, the outlet 161EB of each of the discharge ports 161E, 161E1, and 161E2 may have a width in the horizontal direction in the range of 5 mm to 16 mm and a width in the vertical direction in the range of 0.1 mm to 1 mm.

In addition, various modified examples such as an example in which the inlet 161EA of each of the discharge ports 161E, 161E1, and 161E2 may have an elliptical or circular shape and the outlet 161EB of each of the discharge ports 161E, 161E1, and 161E2 may have an elliptical or slit shape are possible.

Referring to FIG. 10 again, the auxiliary member 170 may be provided on the inclined surface of the first bowl 161. The auxiliary member 170 may cover a portion or the entirety of the outlet of the discharge port 161E1, but a gap may be formed between the auxiliary member 170 and the outlet. A width D2 of the gap of the auxiliary member 170 may be provided to be smaller than a width D1 of the outlet, such that a fine outlet may be formed.

In addition, since the auxiliary member 170 has the gap formed between the auxiliary member 170 and the first bowl 161 at a width smaller than that of the outlet of the discharge port 161E1 while surrounding the outlet of the discharge port 161E1, when the rinse liquid is discharged along the gap, it is possible to prevent the rinse liquid from being scattered, similar to a case where the rinse liquid is discharged through the buffer space 162B. That is, it is possible to prevent the rinse liquid from splashing in an upward direction in which the substrate W is provided by changing a discharge direction of the rinse liquid from the horizontal direction to the downward direction.

In addition, a width of the auxiliary member 170 in the horizontal direction may be greater than a width of the outlet of the discharge port 161E1 in the horizontal direction. Accordingly, the rinse liquid may spread while being guided along a length of the auxiliary member 170 in the horizontal direction.

It has been illustrated that the auxiliary member 170 has a structure in which it protrudes from the inclined surface of the first bowl 161, but the present disclosure is not limited thereto. As another example, the auxiliary member 170 may be formed in the form of a bent or curved plate and may be provided parallel to the inclined surface of the first bowl 161.

Hereinafter, another example of the inclined surface of the first bowl 161 will be described. A first bowl 161 to be mentioned below may be different from the first bowl 161 described above only in a shape of an inclined surface, and may be the same as the first bowl 161 described above in all cleaning structures using a rinse liquid. In other words, discharge ports 161E, 161E1, and 161E2 and an upper base 162 may be provided identically or similarly.

FIG. 14 is a view illustrating an inclined surface of another type of first bowl in the substrate treating apparatus according to some exemplary embodiments of the present disclosure. Referring to FIG. 14, a first bowl 161 according to the present exemplary embodiment may have a first surface 161S1, a second surface 161S2, a third surface 161S3, and a fourth surface 161S4, like or similar to the first bowl 161 according to a third exemplary embodiment.

However, the second surface 161S2 of the first bowl 161 according to the present exemplary embodiment may have an inclination direction different from that of the third surface 161S3 unlike the above-described exemplary embodiment. For example, the second surface 161S2 may form an inclined surface ascending toward a boundary surface with the third surface 161S3. In addition, various modified examples such as an example in which the second surface 161S2 may have a curved surface or concave structure are possible.

FIG. 15 is a view illustrating bake chambers and a transfer chamber together in the substrate treating apparatus according to some exemplary embodiments of the present disclosure.

Referring to FIG. 15, a substrate treating apparatus 10 according to the present exemplary embodiment may include bake chambers 11, a transfer chamber 12, and buffer chambers 14 together with liquid treating chambers 100.

The transfer chamber 12 may be provided between the bake chambers 11 and the liquid treating chambers 100. The transfer chamber 12 may transfer substrates between the bake chambers 11, the liquid treating chambers 100, and the buffer chambers 14. As an example, the transfer chamber 12 may include a hand (no reference numeral) on which a substrate is put, and the hand may move along a guide rail (no reference numeral) to be able to move forward and rearward, and may have a structure in which it may move upward and downward and rotate.

The bake chambers 11 may heat the substrates on which liquid films have been treated in the liquid treating chambers 100, and may be provided in a row on one side of the transfer chamber 12. In addition, the bake chamber 11 may have a polyhedral structure (rectangular parallelepiped structure, etc.) in which a space is formed.

For example, the bake chamber 11 may include a cooling unit 11A and a heating unit 11B disposed therein so as to perform a heating process of heating a wafer and a cooling process of cooling the wafer. In addition, an entrance (not illustrated) is formed in a sidewall of the bake chamber 11, such that a substrate may enter or exit from the bake chamber 11.

The exemplary embodiments of the present disclosure have been described hereinabove with reference to the accompanying drawings, but it will be understood by one of ordinary skill in the art to which the present disclosure pertains that various modifications and alterations may be made without departing from the technical spirit or essential feature of the present disclosure. Therefore, it is to be understood that the exemplary embodiments described above are illustrative rather than being restrictive in all aspects.

What is claimed is:

1. A substrate treating apparatus comprising:
a spin chuck supporting a substrate;
a rinse liquid supply unit supplying a rinse liquid; and
a bowl member surrounding the spin chuck,
wherein the bowl member includes:
a first bowl including an inclined surface inclined downward in an outward direction and having an upper surface of which at least a portion has a curvature; and
an upper base spaced part from the spin chuck and disposed on the first bowl,
a space between the upper surface of the first bowl and a lower surface of the upper base forms a first flow passage and at least a portion of the first flow passage is formed in an arc shape along the upper surface of the first bowl, and
the rinse liquid is supplied toward the inclined surface of the first bowl through the first flow passage,
wherein the upper base includes a first body and at least one second flow passage penetrating through the first body and connected to the first flow passage, and
wherein an inlet through which the rinse liquid is introduced is formed in the second flow passage,
an outlet through which the rinse liquid is discharged is more adjacent to the first flow passage than the second flow passage, and
the first flow passage has a greater height than the second flow passage or is bent one or more times with respect to the second flow passage.

2. The substrate treating apparatus of claim 1, wherein the upper base includes a protrusion part protruding from a lower surface thereof in a downward direction so as to face the inclined surface of the first bowl,
a buffer space is formed by the inclined surface of the first bowl, the lower surface of the upper base, and the protrusion part, and
the rinse liquid passes through the buffer space and is discharged to the inclined surface of the first bowl.

3. The substrate treating apparatus of claim 2, wherein the upper surface of the first bowl protrudes at an edge thereof, such that a step is formed,
the second flow passage, the first flow passage, and the buffer space are sequentially formed in an outward direction of the bowl member, and

the upper base has a first gap formed between the upper base and the step of the first bowl so as to allow the first flow passage and the buffer space to communicate with each other.

4. The substrate treating apparatus of claim 3, wherein a second gap is formed between a lower end of the protrusion part and the first bowl so that the outlet through which the rinse liquid is discharged is formed at a lower portion of the buffer space,
the buffer space decreases from an upper portion thereof toward a lower portion thereof, and
the upper base has a ring shape in which it surrounds the spin chuck.

5. The substrate treating apparatus of claim 1, wherein the first bowl includes a second body and at least one discharge port penetrating through the second body and discharging the rinse liquid.

6. The substrate treating apparatus of claim 5, wherein the discharge port has a width in a horizontal direction that increases toward the outside.

7. The substrate treating apparatus of claim 6, wherein the discharge port has a fan shape in which a width thereof increases from an inlet thereof toward an outlet thereof.

8. The substrate treating apparatus of claim 6, wherein at least a partial region of the discharge port has a width in a vertical direction that decreases toward the outside.

9. The substrate treating apparatus of claim 8, wherein the discharge port has the same cross-sectional area in an inlet and an outlet thereof.

10. The substrate treating apparatus of claim 6, wherein an outlet of the discharge port has a width in the horizontal direction in a range of 5 mm to 16 mm and a width in a vertical direction in a range of 0.1 mm to 1 mm.

11. The substrate treating apparatus of claim 5, further comprising a fan filter unit forming airflow in a downward direction above the spin chuck,
the inclined surface of the first bowl has a first surface, a second surface, and a third surface sequentially formed from an upper portion thereof toward a lower portion thereof,
the second surface has an inclination angle different from those of the first surface and the third surface or has an inclination direction changed from those of the first surface and the third surface, and
some of a plurality of discharge ports have outlets formed on the first surface and the others of the plurality of discharge ports have outlets provided on the second surface or provided on a boundary surface between the first surface and the second surface.

12. The substrate treating apparatus of claim 5, further comprising an auxiliary member surrounding an outlet of the discharge port, having a gap formed between the auxiliary member and the first bowl at a width smaller than that of the outlet of the discharge port, and discharging the rinse liquid along the gap.

13. The substrate treating apparatus of claim 1, wherein the rinse liquid supply unit includes:
a first rinse liquid line supplying the rinse liquid to a lower surface of the substrate; and
a second rinse liquid line branched from the first rinse liquid line and supplying the rinse liquid to the bowl member or the upper base.

14. The substrate treating apparatus of claim 1, wherein the upper base is fixed to the first bowl.

15. A substrate treating apparatus comprising:
a spin chuck supporting a substrate;
a rinse liquid supply unit supplying a rinse liquid;

a bowl member surrounding the spin chuck; and a fan filter unit forming airflow in a downward direction above the spin chuck, wherein the bowl member includes:

a first bowl including an inclined surface inclined downward in an outward direction and having a first surface, a second surface, and a third surface sequentially formed from an upper portion thereof toward a lower portion thereof, including at least one discharge port discharging the rinse liquid and having an outlet having a greater width in a horizontal direction and a smaller width in a vertical direction than an inlet, and having a step formed by protrusion of an edge of an upper surface of which at least a portion has a curvature;

an upper base disposed on the first bowl; and an auxiliary member surrounding outlets of one or more discharge ports, and having a gap formed between the auxiliary member and the first bowl at a width smaller than that of the outlet of the discharge port, the second surface has an inclination angle different from those of the first surface and the third surface or has an inclination direction changed from those of the first surface and the third surface, some of a plurality of discharge ports have outlets formed on the first surface and the others of the plurality of discharge ports have outlets provided on the second surface or provided on a boundary surface between the first surface and the second surface, a space between the upper surface of the first bowl and a lower surface of the upper base forms a first flow passage and at least a portion of the first flow passage is formed in an arc shape along the upper surface of the first bowl, the upper base includes a first body, at least one second flow passage penetrating through the first body and connected to the first flow passage, and a protrusion part protruding from a lower surface of the first body in the downward direction so as to face the inclined surface of the first bowl, and has a first gap formed between the upper base and the step of the first bowl outside the first flow passage, the first flow passage has a greater height than the second flow passage or is bent one or more times with respect to the second flow passage, a buffer space is formed by the inclined surface of the first bowl, the lower surface of the upper base, and the protrusion part, the second flow passage, the first flow passage, and the buffer space are sequentially formed in an outward direction of the bowl member, an inlet through which the rinse liquid is introduced is formed in the second flow passage, and an outlet through which the rinse liquid is discharged is more adjacent to the first flow passage than the second flow passage, and the rinse liquid sequentially passes through the second flow passage, the first flow passage, and the buffer space and is discharged to the inclined surface of the first bowl.

\*    \*    \*    \*    \*